(12) United States Patent
Xiong et al.

(10) Patent No.: US 11,947,396 B2
(45) Date of Patent: Apr. 2, 2024

(54) SUPPORT ASSEMBLY, METHOD FOR MANUFACTURING SAME, AND DISPLAY DEVICE

(71) Applicants: Chengdu BOE Optoelectronics Technology Co., Ltd., Sichuan (CN); BOE Technology Group Co., Ltd., Beijing (CN)

(72) Inventors: Ren Xiong, Beijing (CN); Lei Zhang, Beijing (CN); Zhihui Wang, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/574,390

(22) Filed: Jan. 12, 2022

(65) Prior Publication Data
US 2022/0269310 A1    Aug. 25, 2022

(30) Foreign Application Priority Data

Feb. 23, 2021    (CN) .......................... 202110204741.1

(51) Int. Cl.
*G06F 1/16*    (2006.01)
(52) U.S. Cl.
CPC .......... *G06F 1/1652* (2013.01); *G06F 1/1656* (2013.01)
(58) Field of Classification Search
CPC .... G06F 1/1652; G06F 1/1656; G06F 1/1637; H01L 51/0097; G09F 9/301
See application file for complete search history.

(56) References Cited

U.S. PATENT DOCUMENTS

| 11,398,504 | B2* | 7/2022 | Qin | H01L 27/1244 |
| 2018/0097197 | A1 | 4/2018 | Han et al. | |
| 2019/0132987 | A1* | 5/2019 | Koo | H05K 5/0217 |
| 2021/0168929 | A1 | 6/2021 | Wang et al. | |
| 2022/0043485 | A1* | 2/2022 | Park | H05K 5/04 |
| 2023/0156934 | A1* | 5/2023 | Jiang | G06F 1/1616 |
| | | | | 361/807 |

FOREIGN PATENT DOCUMENTS

| CN | 110853520 A | 2/2020 | |
| CN | 111316344 A | 6/2020 | |
| CN | 111508370 A | 8/2020 | |
| CN | 211654164 U | * 10/2020 | |
| CN | 211654164 U | 10/2020 | |
| WO | WO-2021217845 A1 | * 11/2021 | ............. G09F 9/301 |

OTHER PUBLICATIONS

CN202110204741.1 first office action.

* cited by examiner

*Primary Examiner* — James Wu
(74) *Attorney, Agent, or Firm* — IPro, PLLC

(57) ABSTRACT

Provided is a support assembly. The support assembly includes at least one bending region, and a first surface and a second surface opposite to the first surface; wherein the at least one bending region is provided with a plurality of blind holes, wherein the plurality of blind holes are disposed in the second surface, the plurality of blind holes are arranged in an array, and a lengthwise direction of each of the plurality of blind holes is consistent with a bending direction of the bending region.

20 Claims, 6 Drawing Sheets

--Prior Art--

SUPPORT ASSEMBLY, METHOD FOR MANUFACTURING SAME, AND DISPLAY DEVICE

CROSS-REFERENCE TO RELATED APPLICATION

This application is based on and claims priority to Chinese Patent Application No. 202110204741.1, filed Feb. 23, 2021 and entitled "SUPPORT ASSEMBLY AND DISPLAY DEVICE," the disclosure of which is herein incorporated by reference in its entirety.

TECHNICAL FIELD

The present disclosure relates to the field of display technologies, and more particularly, relates to a support assembly, a method for manufacturing the same, and a display device.

BACKGROUND

With the diversification of flexible display products, foldable display products are popular among users due to their portability and large size upon unfolding. The foldable display product generally employs a substrate made of a flexible material, such that the foldable display product achieves a bending effect. At present, a support assembly is usually disposed on a back of a flexible display panel to support the flexible display panel.

SUMMARY

In a first aspect of embodiments of the present disclosure, a support assembly is provided. The support assembly includes: at least one bending region, and a first surface and a second surface opposite to the first surface; wherein the at least one bending region is provided with a plurality of blind holes, wherein the plurality of blind holes are disposed in the second surface, the plurality of blind holes are arranged in an array, and a lengthwise direction of each of the plurality of the blind holes is consistent with a bending direction of the bending region.

In some embodiments, a ratio of a depth of each of the blind holes to a thickness of the support assembly is in a range of $1/3$ to $2/3$.

In some embodiments, the bending region includes a flat region, a gradual region, and a steep region that are successively disposed along a stress enhancement direction, and the blind hole satisfies at least one of the following conditions: an area of an orthographic projection, on the second surface, of the blind hole in per unit area is successively increased, in a flat region, a gradual region, and a steep region; and a depth of the blind hole in the flat region, a depth of the blind hole in the gradual region, and a depth of the blind hole in the steep region are successively increased.

In some embodiments, the plurality of blind holes include a first blind hole array, a second blind hole array, and a third blind hole array.

In some embodiments, the first blind hole array is disposed at least in the flat region.

In some embodiments, the first blind hole array is disposed in the flat region, the gradual region, and the steep region.

In some embodiments, the second blind hole array is disposed at least in the gradual region.

In some embodiments, the second blind hole array is disposed in the gradual region and the steep region.

In some embodiments, the third blind hole array is disposed in the steep region.

In some embodiments, a length of the blind hole in the first blind hole array, a length of the blind hole in the second blind hole array, and a length of the blind hole in the third blind hole array are successively increased.

In some embodiments, a width of the blind hole in the first blind hole array, a width of the blind hole in the second blind hole array, and a width of the blind hole in the third blind hole array are successively increased.

In some embodiments, the depth of the blind hole in the first blind hole array, the depth of the blind hole in the second blind hole array, and the depth of the blind hole in the third blind hole array are successively increased.

In some embodiments, a spacing between the adjacent blind holes in the first blind hole array, a spacing between the adjacent blind holes in the second blind hole array, and a spacing between the adjacent blind holes in the third blind hole array are successively increased.

In some embodiments, a number of blind holes in the flat region, a number of blind holes in the gradual region, and a number of blind holes in the steep region are successively increased.

In some embodiments, lengths of the plurality of blind holes are equal.

In some embodiments, spacings between the adjacent blind holes are equal.

In a second aspect of embodiments of the present disclosure, a display device is provided. The display device includes: a flexible display panel and a support assembly, the support assembly including at least one bending region, and a first surface and a second surface opposite to the first surface; wherein the at least one bending region is provided with a plurality of blind holes, wherein the plurality of blind holes are disposed in the second surface, the plurality of blind holes are arranged in an array, and a lengthwise direction of the blind hole is consistent with a bending direction of the bending region; and wherein the flexible display panel is disposed on the first surface of the support assembly.

In some embodiments, the display device is a foldable display device, and the bending region of the support assembly is disposed at a foldable position.

In some embodiments, the display device is a curved display device, and the bending region of the support assembly is disposed at an edge of the support assembly.

In the embodiments of the present disclosure, a method for manufacturing a support assembly is provided. The method includes: disposing a plurality of blind holes on the support assembly by a laser cutting, the support assembly including at least one bending region, and a first surface and a second surface opposite to the first surface; wherein the at least one bending region is provided with the plurality of blind holes, the blind holes are disposed in the second surface, the plurality of blind holes are arranged in an array, and a lengthwise direction of the blind hole consistent with a bending direction of the bending region.

BRIEF DESCRIPTION OF THE DRAWINGS

The accompanying drawings here which are incorporated into and constitute a part of this description, illustrate the embodiments consistent with the disclosure and explain the principles of the present disclosure together with the description.

For clearer descriptions of the technical solutions of the present disclosure or the related art, the following will briefly introduce the drawings that are used to describe the embodiments or the related art. Apparently, the accompanying drawings in the following description only show some embodiments of the present disclosure, and those with ordinary skill in the art can still derive other drawings from these accompanying drawings without any creative efforts.

Figure 1:
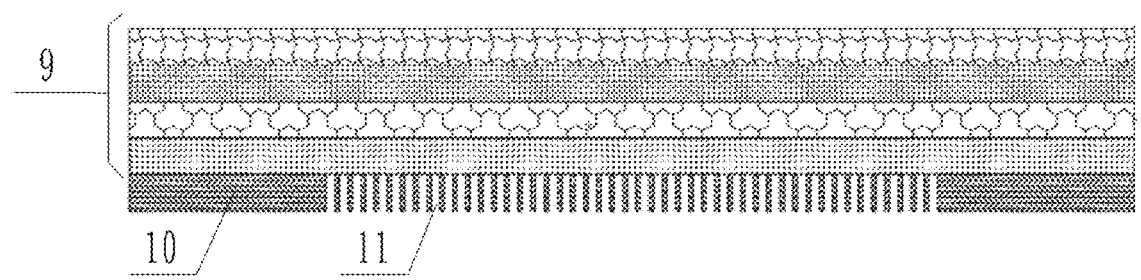
FIG. 1 is a schematic structural diagram of a flexible display panel and a support assembly when being attached to each other in the related art.

Reference numerals and denotations thereof: 1—bending region; 2—flat region; 3—gradual region; 4—steep region; 5—blind hole; 6—first blind hole array; 7—second blind hole array; 8—third blind hole array; 9—display panel; 10—support assembly; and 11—hollowed portion.

DETAILED DESCRIPTION

For clearer descriptions of the objectives, technical solutions, and advantages of the embodiments, the technical solutions according to the embodiments of the present disclosure will be clearly and completely described below, with reference to the accompanying drawings in the embodiments of the present disclosure. Apparently, the described embodiments are part of the embodiments of the present disclosure, not all of the embodiments. Based on the embodiments of the present disclosure, all other embodiments obtained by those with ordinary skill in the art without creative efforts should fall within the protection scope of the present disclosure.

The present disclosure will be further described in detail below with reference to the drawings and specific embodiments.

In the related art, a support assembly is disposed on the back of the flexible display panel to support the flexible display panel. The support assembly is generally hollowed out, which can be bent while ensuring the support for the flexible display panel.

As shown in FIG. 1, a plurality of hollowed portions 11 are disposed in the support assembly 10 in the related art, which can be bent while ensuring the support for the flexible display panel 9. However, the flatness of the support assembly with this hollow structure is poor. In the case that the support 10 is attached to the flexible display panel 9, since each area of the hollowed portion 11 may not support the flexible display panel 9, the flexible display panel 9 is partially supported by the different support force, such that on the front of the flexible display panel 9, the appearance defects such as stamping and indentation may be observed clearly.

In order to avoid the appearance defects such as stamping and indentation can be clearly observed on the front of the flexible display panel, a display device is provided in an embodiment of the present disclosure.

Figure 2:
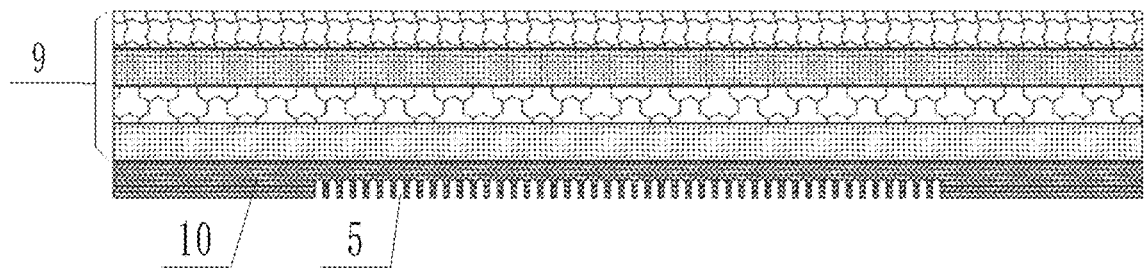
FIG. 2 is a schematic structural diagram of a flexible display panel and a support assembly when being attached to each other according to an embodiment of the present disclosure.

As shown in FIG. 2, the display device includes a display panel 9 and a support assembly 10, wherein the support assembly 10 is mounted on a side of the display panel 9 to support the display panel 9. The support assembly 10 includes a first surface and a second surface opposite to the first surface, and the display panel 9 is disposed on the first surface of the support assembly 10.

The display panel 9 is a flexible display panel. Exemplarily, the display panel 9 is a flexible organic light-emitting diode (OLED) display panel 9. The support assembly 10 is connected to the flexible display panel 9 by an optical glue or other adhesive glue.

Figure 3:
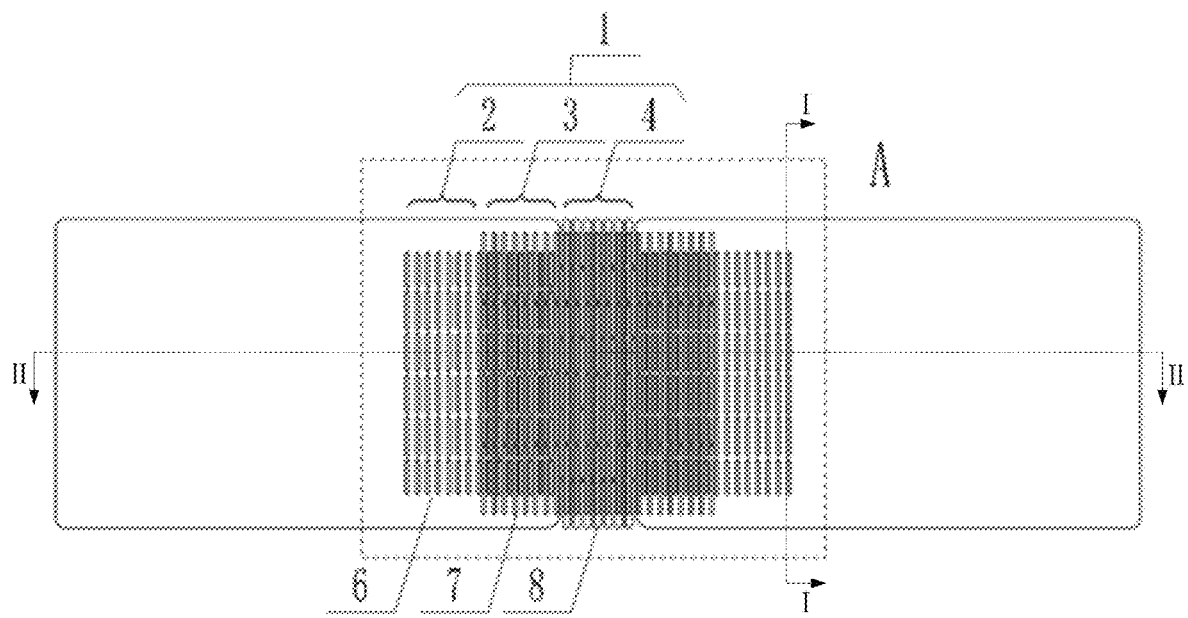
FIG. 3 is a schematic structural diagram of a support assembly in the case that the flexible display panel is configured to be a foldable structure according to an embodiment of the present disclosure.
Figure 4:
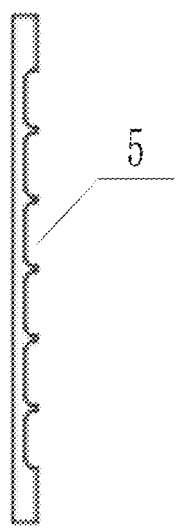
FIG. 4 is a cross-sectional view of the support assembly in a right view direction according to an embodiment of the present disclosure.
Figure 5:
FIG. 5 is a cross-sectional view of the support assembly in a top view direction according to an embodiment of the present disclosure.

The specific structure of the support assembly 10 is explained hereinafter in conjunction with the drawings:

As shown in FIG. 3, the support assembly 10 includes at least one bending region 1. FIG. 4 is a cross-sectional view of I-I in FIG. 3, and FIG. 5 is a cross-sectional view of II-II in FIG. 3. As shown in FIGS. 4 and 5, a plurality of blind holes 5 are disposed in the at least one bending region 1, and the blind holes 5 are disposed on the second surface of the support assembly 10. The plurality of blind holes 5 are arranged in an array, for example, in a rectangular array. A lengthwise direction of each of the blind holes 5 is consistent with a bending direction of the bending region 1.

In some embodiments, the ratio of the depth of each of the blind holes 5 to the thickness of the support assembly 10 is in a range of $1/3$ to $2/3$, in order to further enhance the bending performance of the bending region.

In the case that the display device is bent, a stress concentration is present in the bending region. The bending performance of the support assembly 10 can be improved by disposing the blind holes 5 in the bending region. The more concentrated the stress is, the more blind holes 5 are opened, such that the stress can be dispersed.

The support assembly 10 includes a bending region 1 and a non-bending region, wherein the non-bending region refers to a region outside the bending region 1. As shown in FIG. 3, the non-bending region is disposed on both sides of the bending region 1. The bending region 1 is configured to be used in the folding or bending deformation of the display panel 9. In the case that the bending region 1 of the display panel 9 is folded or bent, the non-bending region of the support assembly 10 may support the non-bending region of the display panel 9.

The number of bending regions 1 of the support assembly 10 can be set to one, two, or more. The more the bending regions 1 are disposed, the higher the degree of freedom that the corresponding support assembly 10 may be folded or bent, and the number of bending regions 1 is consistent with the number of regions on the display panel 9 that are supposed to be folded or bent.

In some embodiments, the non-bending region of the support assembly 10 is made of a hard material to supply a stable support to the display panel 9, while the bending region 1 of the support assembly 10 is made of a flexible material, such that the bending region 1 can follow the display panel 9 for folding or bending.

In some embodiments, the bending region 1 and the non-bending region are integrally formed to facilitate processing. Exemplarily, the support assembly is made of stainless steel, which is rigid and bendable.

As shown in FIG. 2, the first surface of the support assembly 10 is a support surface for supporting the display panel 9, the second surface of the support assembly 10 is an open surface, on which the blind hole 5 is disposed. A plurality of blind holes 5 are opened outwardly on a side of the open surface, and in the case that the support assembly 10 is lying flat, the support surface is a flat surface. The flexible display panel 9 is attached to the support surface of the support assembly 10, and the bending region 1 of the support assembly 10 is opposite to the bending area of the display panel 9. Exemplarily, in the case that the display panel 9 is a foldable structure and only one bending region is disposed at the position of the center line, the bending region 1 of the support assembly 10 is disposed at position of the center line, as shown in FIG. 3. In the case that the display panel 9 is folded inward or unfolded outward, the support assembly 10 may be folded inward or unfolded outward in synchronization with the display panel 9. In the case that the foldable display panel 9 is configured to be a two-fold structure, that is, two bending regions are disposed on the display panel 9, two bending regions 1 are also disposed on the support assembly 10.

Figure 7:
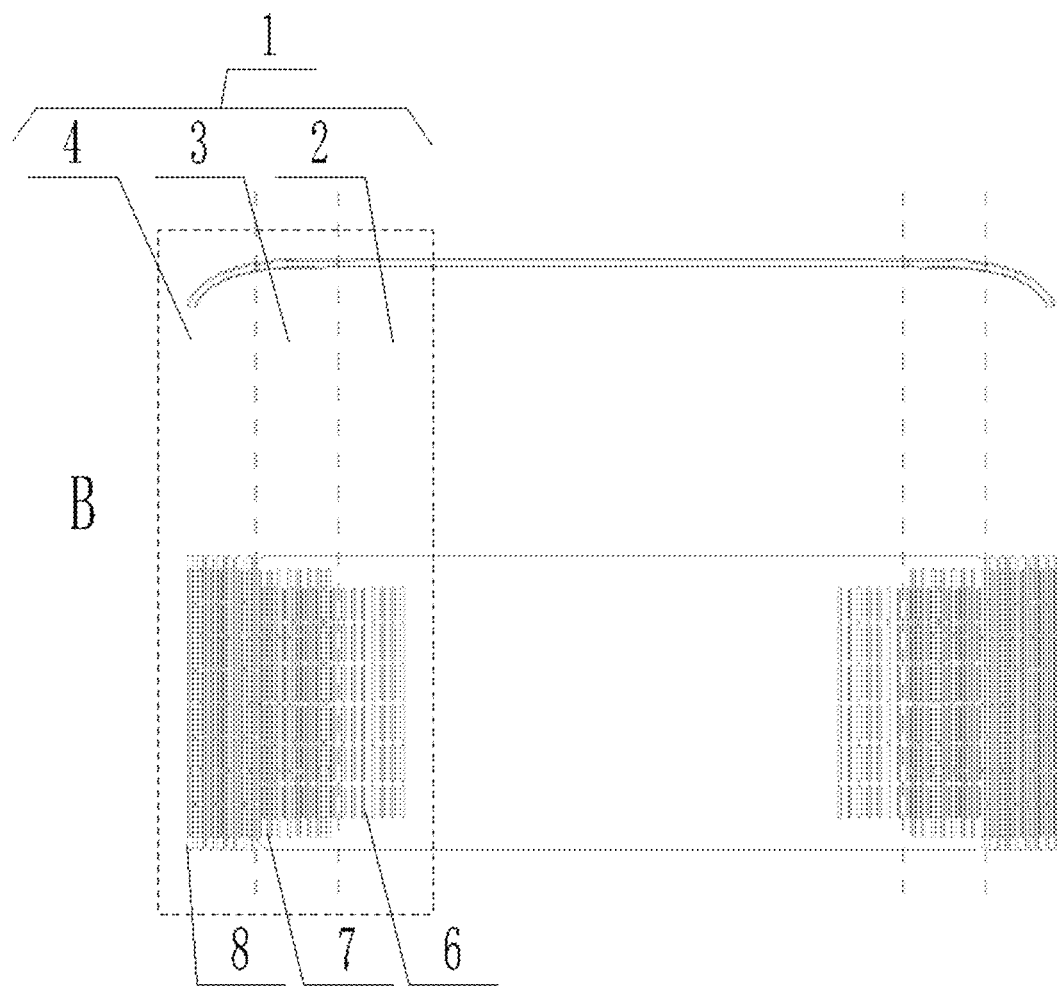
FIG. 7 is a schematic structural diagram of a support assembly in the case that the flexible display panel is configured to be a curved structure according to an embodiment of the present disclosure.

In the case that the display panel 9 is a curved structure, at least two the bending regions 1 of the display panel 9 should be disposed. Taking the cell phone as an example, in the case that the display panel 9 is a curved display panel of the cell phone, as shown in FIG. 7, two bending regions 1 are disposed on the support assembly 10 and are symmetrically arranged at both ends of the support assembly 10, in order to ensure the supporting ability of the display panel 9.

In summary, as shown in FIGS. 4 and 5, in this embodiment, the support assembly 10 is not penetrated, but blind holes 5 arranged in a rectangular array are used instead of the hollowed portion 11 in the related art. A stack structure formed by the support assembly 10 and the display panel 9 attached to each other is shown in FIG. 2, and as clearly seen in FIG. 2, the bonding surface between the support assembly 10 and the display panel 9 is relatively flat with good flatness. The support assembly 10 in the embodiments of the present disclosure is not only applicable to foldable products or curved products in the related art, but also applicable to situations where the hardness of a local region on the support assembly 10 needs to be reduced. Therefore, the overall weight of the product may be reduced, while the local performance differentiation of the support assembly 10 is achieved.

In some embodiments, the cross-section of the blind hole 5 may be a nephric circle, a circular, an oval, or a polygon, and the specific shape of the blind hole 5 can be designed in advance as required. In the embodiment of the present disclosure, the blind hole 5 with a nephric circle shape is described as an example.

Figure 6:
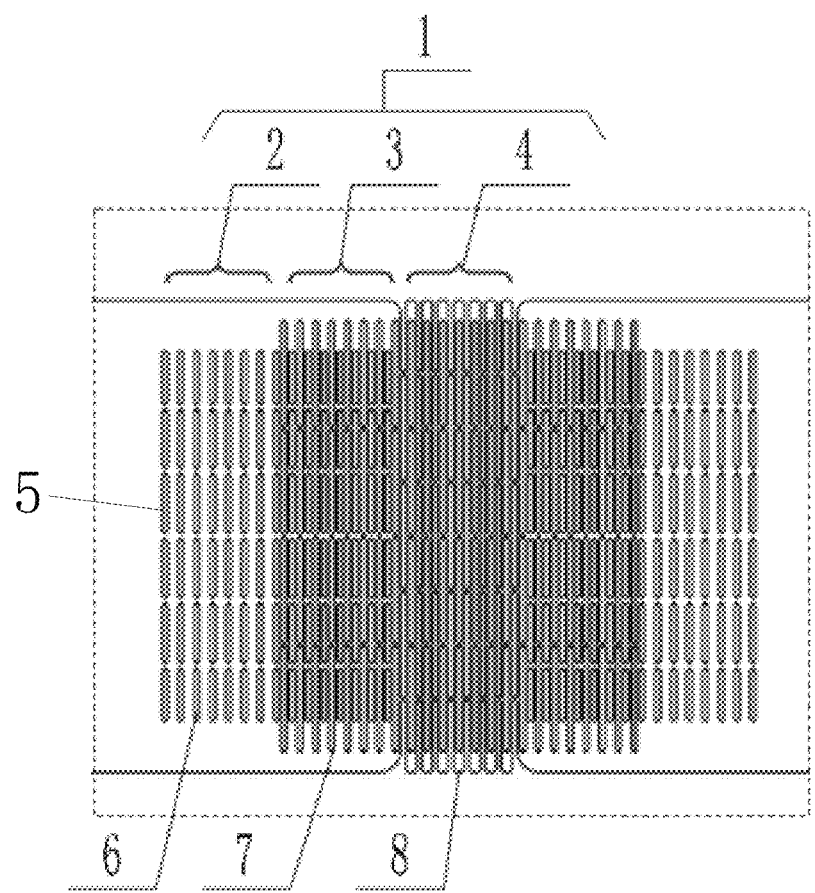
FIG. 6 is an enlarged partial view of a position A of the support assembly in FIG. 3.
Figure 8:
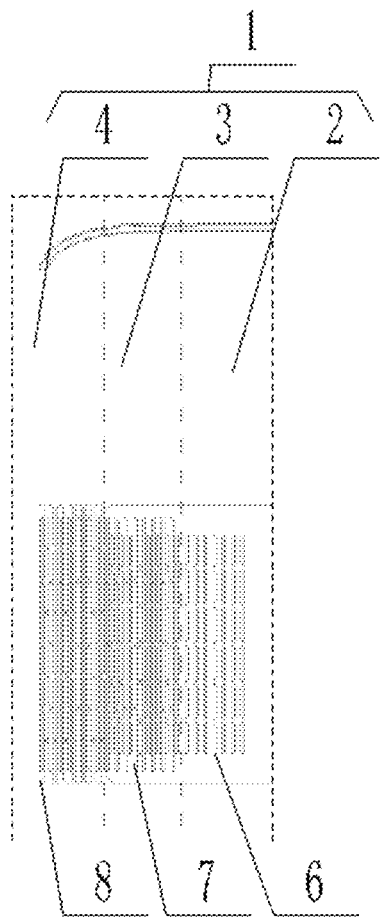
FIG. 8 is an enlarged partial view of a position B of the support assembly in FIG. 7.

As shown in FIGS. 6 and 8, the bending region 1 includes a flat region 2, a gradual region 3 and a steep region 4 successively along the direction of stress enhancement.

The support assembly 10 shown in FIG. 6 is suitable for foldable display devices. In the support assembly 10, the bending region 1 is disposed in the middle portion of the support assembly 10. In the case that the support assembly 10 is bent, the stress is most concentrated at the position closest to the centerline of the bending region 1, and the stress is less in the region farther from the centerline of the bending region 1. According to the stress distribution, the bending region 1 can be divided into the flat region 2, the gradual region 3 and the steep region 4.

The stress in the steep region 4 is the most concentrated and is close to the middle of bending region 1, and the stress in the gradual region 3 is also concentrated and is less than that in steep region 4. The stress in the flat region 2 is less than that in the gradual region 3. The stress of the flat region 2 is less than the stress of the gradual region 3. The flat region 2 is adjacent to the non-bending region, and the gradual region 3 is disposed between the steep region 4 and the flat region 2.

The support assembly 10 shown in FIG. 7 is suitable for a curved display device. As shown in FIG. 8, two bending regions 1 are disposed in the support assembly 10, and the two bending regions 1 are symmetrically disposed at both ends of the support assembly 10. The region with the greatest bending degree in the bending region 1. That is, the region with the most concentrated stress is the steep region 4, the region with the least bending degree is the flat region 2, the region with the bending degree between the flat region 2 and the steep region 4 is the gradual region 3, and flat region 2 is adjacent to non-bending region.

In some embodiments, in the flat region 2, the gradual region 3, and the steep region 4, the area of the orthographic projection, on the second surface, of the blind hole 5 in the unit area is successively increased.

In the case that the depths of the blind holes 5 are equal, in the same region, the greater the sum of the areas of the orthographic projections, on the second surface, of all the blind holes 5, the stronger the bending ability of the region is present, On the contrary, the less the sum of the areas, the weaker the bending ability of this region is present. For example, in the case that no blind hole 5 is present in this region, that is, in the case that the sum of areas is 0, the bending ability is the weakest. In the flat region 2, the gradual region 3, and the steep region 4, the area of the orthographic projection, on the second surface, of the blind hole 5 in the unit area is successively increased, such that the steep region 4 is provided with the strongest bending ability, and the bending ability of the gradual region 3 is between the bending ability of the steep region 4 and the bending ability of the flat region 2.

In some embodiments, the depth of the blind hole 5 in the flat region 2, the depth of the blind hole 5 in the gradual region 3, and the depth of the blind hole 5 in the steep region 4 are successively increased.

The greater the depth of the blind hole 5, the smaller thickness of the support assembly in the region where the blind hole 5 is disposed, and the easier the support assembly is to be bent. By setting the depth of the blind hole 5 in the steep region 4 to the maximum, the steep region 4 is provided with the strongest bending ability, and the bending ability of the gradual region 3 is between the bending ability of the steep region 4 and the bending ability of the flat region 2.

In some embodiments, the plurality of blind holes 5 include a first blind hole array, a second blind hole array, and a third blind hole array, wherein the first blind hole array is disposed at least in the flat region 2, the second blind hole array is disposed at least in the gradual region 3, and the third blind hole array is disposed at the steep region 4.

According to the embodiments of the present disclosure, the first blind hole array, the second blind hole array and the third blind hole array are arranged side by side, and the first blind hole array is disposed in the flat region 2, the second blind hole array is disposed in the gradual region 3, and the third blind hole array is disposed in the steep region 4. Since the flat region 2, the gradual region 3, and the steep region 4 are connected to each other in sequence, correspondingly, the first blind hole array, the second blind hole array, and the third blind hole array, are connected to each other in sequence.

Since the stress of the flat region 2, the stress of the gradual region 3, and the stress of the steep region 4 are increased in sequence, in order to make the regions with greater stress have better bending ability, the number of blind holes 5 in the flat region 2 and the number of blind holes 5 in the gradual region 3 and the number of blind holes 5 in the steep region 4 are successively increased.

In some embodiments, the dimensions of the blind hole 5 are equal, the spacings between adjacent blind holes 5 are equal, and the number of blind holes 5 in the flat region 2, the number of blind holes 5 in the gradual region 3, and the number of blind holes 5 in the steep region 4 are successively increased. That is, the number of blind holes 5 in the steep region 4 is greater than the number of blind holes 5 in the gradual region 3, the number of blind holes 5 in the gradual region 3 is greater than the number of blind holes 5 in the flat region 2. For example, the ratio of the depth of each of the blind hole 5 to the thickness of the support assembly 10 is ⅓ to ⅔, the width of each of the blind holes 5 is set to 0.3 mm, the spacing between the two adjacent blind holes 5 is 0.3 mm, and the length of each of the blind holes 5 is 4 mm.

In some embodiments, the spacings between the adjacent blind holes 5 are equal, and the spacing between the blind holes in the first blind hole array, the spacing between the blind holes in the second blind hole array, and the spacing between the blind holes in the third blind hole array are successively increased. That is, the depths of the plurality of blind holes 5 are successively increased along the direction from the flat region 2 to the steep region 4.

In some embodiments, the length of the blind hole in the first, the length of the blind hole in the second blind hole array, and the length of the blind hole in the third blind hole array are successively increased. That is, the lengths of the plurality of blind holes 5 are successively increased along the direction from the flat region 2 to the steep region 4.

In some embodiments, the width of the blind hole in the first blind hole array, the width of the blind hole in the second blind hole array, and the width of the blind hole in the third blind hole array are successively increased. That is, the widths of the plurality of blind holes 5 are successively increased along the direction from the flat region 2 to the steep region 4.

In some embodiments, when the dimensions of the plurality of blind holes 5 are equal. That is, the length, the width, and the depth are the equal, the spacing between the adjacent blind holes in the first blind hole array, the spacing between the adjacent blind holes in the second blind hole array, and the spacing between the adjacent blind holes in the third blind hole array are successively reduced. That is, the spacings between adjacent blind holes 5 are successively reduced along the direction from the flat region 2 to the steep region 4.

The dimensions of the blind holes 5 in each of the blind hole arrays are equal, and the spacings between adjacent blind holes 5 in each array are equal. In some embodiments, the number of blind holes 5 in the first blind hole array is less than the number of blind holes 5 in the second blind hole array, and the number of blind holes 5 in the second blind hole array is less than the number of blind holes 5 in the third blind hole array.

The depth of the blind hole 5 in the first blind hole array is less than the depth of the blind hole 5 in the second blind hole array, and the depth of the blind hole 5 in the second blind hole array is less than the depth of the blind hole 5 in the third blind hole array.

The length of the blind hole 5 in the first blind hole array is less than the length of the blind hole 5 in the second blind hole array, and the length of the blind hole 5 in the second blind hole array is less than the length of the blind hole 5 in the third blind hole array.

The spacing between the adjacent blind holes 5 in the first blind hole array is greater than the spacing between the adjacent blind holes 5 in the second hole array, and the spacing between the adjacent blind holes 5 in the second hole array is greater than the spacing between the adjacent blind holes 5 in the third hole array.

Other design approaches may also be used, as long as the design can be realized to enhance the bending performance in the direction from the flat region to the steep region.

According to yet another embodiment of the present disclosure, as shown in FIG. 6, the first blind hole array is disposed at least in the flat region 2 and the gradual region 3, the second blind hole array is disposed at the gradual region 3 and the steep region 4, and the third blind hole array is disposed in the steep region 4.

The blind holes 5 in the same blind hole array have the equal dimension, wherein the equal dimension includes the equal length, the equal width, and the equal depth. The spacings between the adjacent blind holes 5 in the same blind hole array are equal.

In some embodiments, the area of the first blind hole array, the area of the second blind hole array, and the area of the third blind hole array are equal. The number of blind holes 5 in the flat region 2 is less than the number of blind holes 5 in the gradual region 3, and the number of blind holes 5 in the gradual region 3 is less than the number of blind holes 5 in the steep region 4, such that the bending ability of the flat region 2 is less than the bending ability of the gradual region 3, and the bending ability of the gradual region 3 is less than the bending ability of the steep region 4.

In some embodiments, the number of blind holes 5 in the first blind hole array is less than the number of blind holes 5 in the second blind hole array, and the number of blind holes 5 in the second blind hole array is less than the number of blind holes 5 in the third blind hole array.

The depth of the blind hole 5 in the first blind hole array is less than the depth of the blind hole 5 in the second blind hole array, and the depth of the blind hole 5 in the second blind hole array is less than the depth of the blind hole 5 in the third blind hole array.

In some embodiments, the length of the blind hole 5 in the first blind hole array is less than the length of the blind hole 5 in the second blind hole array, and the length of the blind hole 5 in the second blind hole array is less than the length of the blind hole 5 in the third blind hole array.

In some embodiments, a spacing between adjacent blind holes 5 in the first blind hole array is greater than a spacing between adjacent blind holes 5 in the second hole array, and a spacing between adjacent blind holes 5 in the second hole array is greater than a spacing between adjacent blind holes 5 in the third hole array.

According to the embodiments of the present disclosure, the first blind hole array is disposed in the flat region 2, the gradual region 3, and the steep region 4. The second blind hole array is disposed in the gradual region 3 and the steep region 4, and the third blind hole array is disposed in the steep region 4, such that the number of blind holes 5 in the flat region 2 is minimized, and the number of blind holes 5 in the gradual region 2 is second, the number of blind holes in the steep region 4 is the largest. The bending ability of the flat region 2 is poorer than the bending ability of the gradual region 3 and is poorer than the bending ability of the steep region 4.

Figure 9:
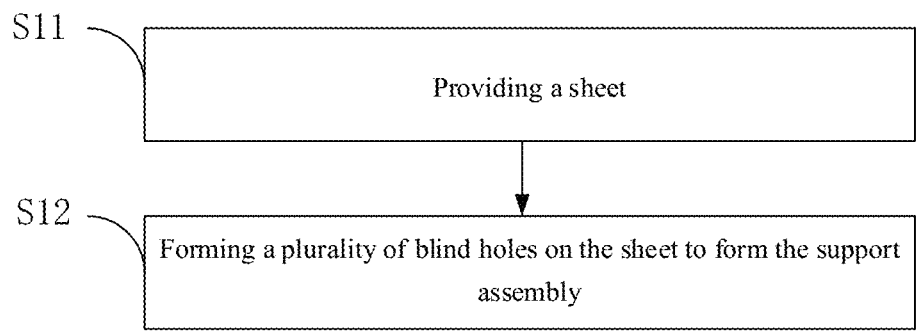
FIG. 9 is a flowchart of a method for manufacturing a support assembly according to an embodiment of the present disclosure.

As shown in FIG. 9, an embodiment of the present disclosure provides a method for manufacturing a support assembly 10. The method includes: acquiring any one of the support assemblies 10 shown in FIGS. 3 to 8 by forming a plurality of blind holes 5 on the support assembly 10 according to this embodiment.

In S11, a sheet is provided.

At least one region of the sheet is used to form the bending region 1.

In S12, a plurality of blind holes 5 are formed on a side of the sheet to form a support assembly.

The formed support assembly 10 includes at least one bending region 1, a first and a second surface opposite to the first surface, a plurality of blind holes 5 are disposed in the at least one bending region 1, the blind holes 5 are disposed on the second surface, the plurality of blind holes 5 are arranged in an array, and a lengthwise direction of the blind hole 5 is consistent with the bending direction of the bending region 1.

In some embodiments, the blind holes 5 are formed by laser cutting or chemical etching.

In some embodiments, a plurality of blind holes 5 are opened in the bending region 1 by a chemical etching process, wherein the etching depth of each of the blind holes 5 is ⅓ to ⅔ of the thickness of the support assembly 10, and the specific etching depth is pre-designed as required.

In some embodiments, the etched width of the blind holes 5 is 0.3 mm, the spacing between two adjacent blind holes 5 is 0.3 mm, and the length of the etched holes of each of the blind holes 5 are 4 mm. In order to ensure that the bending ability of the flat region 2 is poorer than that of the gradual region 3, the bending ability of the gradual region 3 is poorer than that of the steep region 4, and the etching depth of the blind holes 5 in the first blind hole array is less than that in the second blind hole array. The etching depth of the blind holes 5 in the second hole array is less than the etching depth of the blind holes 5 in the third blind hole array.

In some embodiments, a plurality of blind holes 5 are disposed in the bending region 1 by a laser cutting process, wherein the laser cut depth of the blind holes 5 is ⅓ to ⅔ of the thickness of the support assembly 10, and the specific laser cut depth is pre-designed as required.

In some embodiments, the laser cut width of the blind holes 5 is 0.3 mm, the spacing between two adjacent blind holes 5 is 0.3 mm, and the laser cut length of each of the blind holes 5 is 4 mm. In order to ensure that the bending ability of the flat region 2 is less than that of the gradual region 3, the laser cut depth of the blind hole 5 of the first blind hole array is less than the laser cut depth of the blind hole 5 of the second blind hole array, and the laser cut depth of the blind hole 5 in the second blind hole array is less than the laser cut depth of the blind hole 5 in the third blind hole array.

Mold opening is not required in the formation of blind holes 5 by laser cutting, which can shorten the product production cycle, and can flexibly correspond to a large number of differentiated designs. Therefore, insufficiency of chemical etching of the support assembly 10 can be addressed, and more diversified product shapes may be achieved.

An embodiment of the present disclosure provides a display device. The display device includes a flexible display panel 9 and any of the support assemblies 10 shown in FIGS. 3 to 8, wherein the flexible display panel 9 is attached to the first surface of the support assembly 10.

In some embodiments, the display device is a foldable display device and the bending region 1 of the support assembly 10 is foldable.

In some embodiments, the display device is a curved display device. The bending region 1 of the support assembly 10 is disposed at an edge of the support assembly 10. Taking display panel 9 of the cell phone as an example, the two ends of the curved display panel 9 of the cell phone are curved surfaces, and the two bending regions 1 of the support assembly 10 are symmetrically disposed at both ends of the support assembly 10. The design of the blind hole 5 may reduce the hardness of the bending region 1, and effectively prevent the support assembly 10 from rebounding; and furthermore, the design of the blind hole 5 may also ensure the flatness of the bonding surface between the display panel 9 and the support assembly 10.

Figure 10:
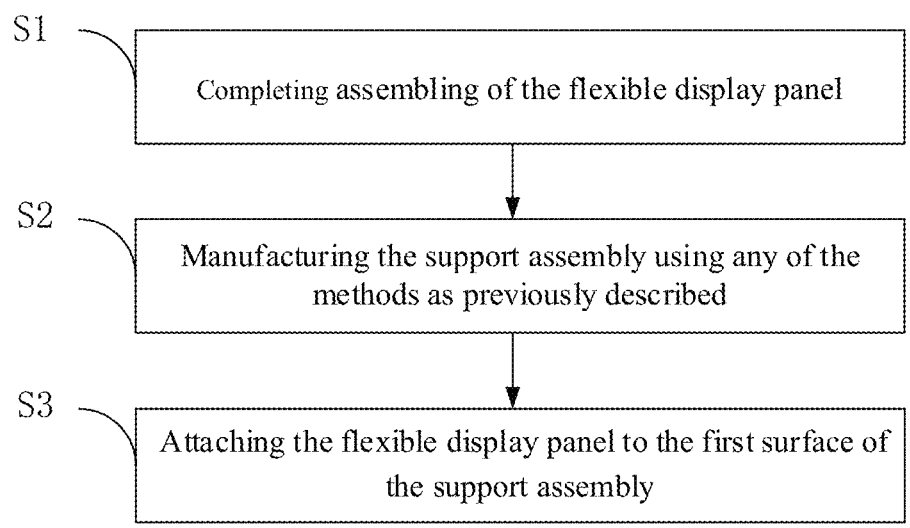
FIG. 10 is a flowchart of a method for manufacturing a display panel according to an embodiment of the present disclosure.

As shown in FIG. 10, an embodiment of the present disclosure provides a method for manufacturing a display device. The method includes the following processes.

In S1, assembling of the flexible display panel 9 is completed.

In S2, the support assembly 10 is manufactured using any of the methods as previously described.

In S3, the flexible display panel 9 is attached to the first surface of the support assembly 10.

In summary, as shown in FIGS. 4 and 5, in this embodiment, the support assembly 10 is not penetrated, but blind holes 5 are disposed in a rectangular array instead of the hollowed portion 11 in the related art. As clearly shown in FIG. 2, with respect to the stack structure conformed by the support assembly 10 and the attached display panel 9, the bonding surface between the support assembly 10 and the display panel 9 is relatively flat and with good flatness. The support ability of the flexible display panel 9 is effectively improved, the ability of recovering deformation upon bending is improved, and the bad appearance of the flexible display panel 9 such as stamping, indentation, and the like are avoided, while the bending capacity is ensured.

The support assembly 10 in the embodiments of the present disclosure is not only suitable for folding products or curved products in the related art, but also suitable for situations where the hardness of a local region on the support assembly 10 is needed to reduce. The overall weight of the product is reduced, while realizing the local performance differentiation of the support assembly 10.

The various embodiments in this description are described in a progressive manner. Several embodiments focus on the differences from other embodiments. The same and similar parts of each embodiment may be referenced to each other.

In the description of the present disclosure, it should be noted that the terms "up," "down," and the like indicating that the orientation or positional relationship based on the orientation or positional relationship shown in the drawings, are only for the convenience of describing the present disclosure and simplifying the description, rather than indicating or implying that the device or element referred to need to have a specific orientation, be constructed and operated in a specific orientation, and therefore cannot be understood as a limitation to the present disclosure. Moreover, the terms "first" and "second" are used for descriptive purposes only and should not be understood as indicating or implying importance; the terms "bottom," "top," "inner," and "outer" refer to the directions facing towards or distal from the geometric direction of a specific part.

In the description of the present disclosure, it should be noted that the terms "mounted," "communicated," "connected," and the like, unless expressly specified and defined otherwise, are to be understood broadly, for example, the connection may be a fixed connection or a removable connection and may be a mechanical connection or an electrical connection; and the communication may be in a direct communication, in an indirect communication through an intermediate medium, or may be a communication between two components. For those skilled in the art, the specific meaning of the above terms in the present disclosure can be understood in specific situations. Further, in the description of the present disclosure, unless otherwise specified, the meaning of "a plurality of" is two or more.

Described above are some exemplary embodiments of the present disclosure and are not intended to limit the present disclosure. Any modification, equivalent replacement, improvement, and the like made within the spirit and principle of the present disclosure should be included within the protection scope of the present disclosure.

What is claimed is:

1. A display device, comprising a flexible display panel and a support assembly, the support assembly comprising at least one bending region, a first surface and a second surface opposite to the first surface; wherein the display device is a curved display device, the bending region of the support assembly is disposed at an edge of the support assembly, the at least one bending region is provided with a plurality of blind holes, the plurality of blind holes is disposed in the second surface, and a lengthwise direction of each of the blind holes is consistent with a bending direction of the bending region;

wherein the bending region comprises a flat region, a gradual region, and a steep region that are disposed successively along a stress enhancement direction, the plurality of blind holes is arranged in a first blind hole array, a second blind hole array and a third blind hole array, each bind hole in the second blind hole array is out of the flat region, each bind hole in the third blind hole array is out of the flat region and the gradual region, a depth of each bind hole in the first blind hole array is less than a depth of each bind hole in the second blind hole array, the depth of each bind hole in the second blind hole array is less than a depth of each bind hole in the third blind hole array, and a ratio of a depth of each of the blind holes to a thickness of the support assembly is in a range of $\frac{1}{3}$ to $\frac{2}{3}$; and wherein the flexible display panel is disposed on the first surface of the support assembly.

2. The display device according to claim 1, wherein the blind hole satisfies at least one of the following conditions:

an area of an orthographic projection, on the second surface, of blind holes in per unit area is successively increased, in the flat region, the gradual region, and the steep region; and a depth of the blind hole in the flat region, a depth of the blind hole in the gradual region, and a depth of the blind hole in the steep region are successively increased.

3. The display device according to claim 1, wherein a length of the flat region in the lengthwise direction of each of the blind holes is less than a length of the gradual region in the lengthwise direction of each of the blind holes, the length of the gradual region in the lengthwise direction of each of the blind holes is less than a length of the steep region in the lengthwise direction of each of the blind holes, and the first blind hole array is disposed at least in the flat region.

4. The display device according to claim 3, wherein the first blind hole array is disposed in the flat region, the gradual region, and the steep region.

5. The display device according to claim 4, wherein the second blind hole array is disposed at least in the gradual region.

6. The display device according to claim 5, wherein the second blind hole array is disposed in the gradual region and the steep region.

7. The display device according to claim 6, wherein the third blind hole array is disposed in the steep region.

8. The display device according to claim 7, wherein a length of each blind hole in the first blind hole array, a length of each blind hole in the second blind hole array, and a length of each blind hole in the third blind hole array are successively increased.

9. The display device according to claim 7, wherein a width of each blind hole in the first blind hole array, a width of each blind hole in the second blind hole array, and a width of each blind hole in the third blind hole array are successively increased.

10. The display device according to claim 7, wherein a spacing between adjacent blind holes in the first blind hole array, a spacing between adjacent blind holes in the second blind hole array, and a spacing between adjacent blind holes in the third blind hole array are successively increased.

11. The display device according to claim 7, wherein a number of blind holes in the flat region, a number of blind holes in the gradual region, and a number of blind holes in the steep region are successively increased.

12. The display device according to claim 1, wherein lengths of the plurality of blind holes are equal.

13. The display device according to claim 1, wherein spacings between adjacent blind holes in the flat region, the gradual region and the steep region are equal.

14. A method for manufacturing a support assembly, comprising: disposing a plurality of blind holes on the support assembly by laser cutting, the support assembly comprising at least one bending region, a first surface and a second surface opposite to the first surface; wherein the bending region of the support assembly is disposed at an edge of the support assembly, the at least one bending region is provided with the plurality of blind holes, the blind holes are disposed in the second surface, and a lengthwise direction of the blind hole consistent with a bending direction of the bending region;

wherein the bending region comprises a flat region, a gradual region, and a steep region that are disposed successively along a stress enhancement direction, the plurality of blind holes is arranged in a first blind hole array, a second blind hole array and a third blind hole array, each bind hole in the second blind hole array is out of the flat region, each bind hole in the third blind hole array is out of the flat region and the gradual region, a depth of each bind hole in the first blind hole array is less than a depth of each bind hole in the second blind hole array, the depth of each bind hole in the second blind hole array is less than a depth of each bind hole in the third blind hole array, and a ratio of a depth of each of the blind holes to a thickness of the support assembly is in a range of ⅓ to ⅔.

15. The method according to claim 14, wherein the blind hole satisfies at least one of the following conditions:
   an area of an orthographic projection, on the second surface, of blind holes in per unit area is successively increased, in the flat region, the gradual region, and the steep region; and
   a depth of the blind hole in the flat region, a depth of the blind hole in the gradual region, and a depth of the blind hole in the steep region are successively increased.

16. The method according to claim 14, wherein a length of the flat region in the lengthwise direction of each of the blind holes is less than a length of the gradual region in the lengthwise direction of each of the blind holes, the length of the gradual region in the lengthwise direction of each of the blind holes is less than a length of the steep region in the lengthwise direction of each of the blind holes, and the first blind hole array is disposed at least in the flat region.

17. The method according to claim 16, wherein the first blind hole array is disposed in the flat region, the gradual region, and the steep region.

18. The method according to claim 17, wherein the second blind hole array is disposed at least in the gradual region.

19. The method according to claim 18, wherein the second blind hole array is disposed in the gradual region and the steep region.

20. The method according to claim 19, wherein the third blind hole array is disposed in the steep region.

* * * * *